(12) United States Patent
Megahed et al.

(10) Patent No.: US 6,803,665 B1
(45) Date of Patent: Oct. 12, 2004

(54) OFF-CHIP INDUCTOR

(75) Inventors: Mohamed A. Megahed, San Diego, CA (US); Kevin J. Cote, Ocotillo, AZ (US); Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/016,309

(22) Filed: Nov. 2, 2001

(51) Int. Cl.$^7$ .......................... H01L 23/48; H01L 21/44; B23K 31/02

(52) U.S. Cl. ...................... 257/780; 257/784; 257/786; 438/617; 228/180.5

(58) Field of Search ...................... 228/180.5; 257/780, 257/737, 738, 776, 784, 786; 438/617, 106, 612, 613

(56) References Cited

U.S. PATENT DOCUMENTS

| | | | | |
|---|---|---|---|---|
| 5,886,393 A | * | 3/1999 | Merrill et al. ............... | 257/531 |
| 6,165,887 A | * | 12/2000 | Ball ........................... | 438/613 |
| 6,194,774 B1 | * | 2/2001 | Cheon ........................ | 257/531 |
| 6,252,178 B1 | * | 6/2001 | Hashemi ..................... | 174/260 |
| 6,424,223 B1 | * | 7/2002 | Wang et al. ................. | 330/286 |

FOREIGN PATENT DOCUMENTS

| | | | | |
|---|---|---|---|---|
| EP | 168607 A1 | * | 1/1986 | ......... C07D/207/16 |
| EP | 515821 A1 | * | 12/1992 | ........... H01F/17/02 |
| EP | 202296 A1 | * | 5/2002 | |
| JP | 04294552 A | * | 10/1992 | ........... H01L/21/60 |
| JP | 10074625 A | * | 3/1998 | ........... H01F/17/00 |

* cited by examiner

*Primary Examiner*—Alonzo Chambliss
(74) *Attorney, Agent, or Firm*—Farjami & Farjami LLP

(57) ABSTRACT

According to an embodiment, a semiconductor die has a source bond pad and a destination bond pad attached to a top surface of the semiconductor die. A stud bump is situated on the destination bond pad. A bonding wire is then ball bonded to the source bond pad and thereafter stitch bonded to the stud bump on the destination bond pad. The bonding wire acts as an off-chip inductor or a portion of an off-chip inductor. In one embodiment a number of bonding-wires and on chip conductors are used to form an off-chip inductor. The inductance of the off-chip inductor can be adjusted or fine-tuned by adjusting a loop height of the one or more bonding wires used in the off-chip inductor. The inductance of the invention's off-chip inductor can also be adjusted by increasing or decreasing the number of bonding wires used to form the off-chip inductor.

15 Claims, 2 Drawing Sheets

OFF-CHIP INDUCTOR

BACKGROUND OF THE INVENTION

1. Field of the Invention

The present invention is generally in the field of semiconductor chip fabrication. More specifically, the present invention is in the field of inductors for semiconductor chips.

2. Background Art

The requirement of smaller, more complex, and faster devices operating at high frequencies, such as wireless communications devices and Bluetooth RF transceivers, has also resulted in an increased demand for small size inductors. These small wireless communication devices and Bluetooth RF transceivers contain semiconductor chip packages and semiconductor dies with power and low noise amplifiers that require small size, high quality factor ("Q") inductors for use in the resonance and matching circuits. Various approaches are currently used for adding small size inductors to semiconductor chip packages and semiconductor dies. However, each of the current approaches has various undesirable side effects associated with it.

One approach for adding small size inductors involves designing inductors into the semiconductor die itself. However, when designing an inductor into the semiconductor die, the amount of area required for the inductor increases the size of the semiconductor die and additional processing of the wafer during fabrication might also be required. Both increasing the size of the semiconductor die and additional processing of the wafer increase the cost and also adversely impacts the yield of the semiconductor die.

One approach for adding small size inductors includes surface mounting discrete inductors onto the package substrate. However, in order to surface mount discrete inductors onto the package substrate, several additional process steps are required. These additional steps in the assembly process, such as surface mounting of the discrete inductors, increases the overall cost of the assembly, and may also reduce the assembly yield. Further, surface mounting discrete inductors onto the package substrate increases the overall size of the assembly.

Yet another approach adds small size inductors to the semiconductor chip package by designing printed inductors onto the semiconductor chip package. However, once the printed inductor has been defined on the package substrate, the inductance of the printed inductor cannot be altered without redesigning the package substrate. Thus, the exact value of the printed inductor must match the predetermined simulated value of inductance required in a particular circuit. One option to alleviate this problem is to trim the inductor by laser after the semiconductor die package has been assembled. Although this option allows the inductance of printed inductor to be adjusted to meet a required value, the above option is costly and difficult to implement.

Thus, there exists a need in the art for structure and method for fabricating an inductor on the surface of a semiconductor die that has a high "Q" and is small in size. Moreover, there exists a need in the art for a structure and method for fabricating an inductor on the surface of a semiconductor die that allows the inductance of the inductor to be easily adjusted to meet a specific design requirement. Further, there exists a need in the art for structure and method for fabricating an inductor on the surface of a semiconductor die that is cost effective and does not increase the size of the semiconductor die.

SUMMARY OF THE INVENTION

The present invention is directed to an off-chip inductor. The various embodiments of the present invention result in a small size and high quality factor inductor on a semiconductor die. Moreover, the present invention allows the inductance of the inductor to be easily adjusted to meet a specific design requirement. Further, the invention is cost effective and does not increase the size of the semiconductor die.

According to an embodiment of the present invention, a semiconductor die has a source bond pad and a destination bond pad attached to a top surface of the semiconductor die. A stud bump is situated on the destination bond pad. In one embodiment, the stud bump is fabricated by first forming a ball bond and then cutting the bonding wire above the bonding point, leaving a stud of bonding wire material on the destination bond pad. A bonding wire is then ball bonded to the source bond pad and thereafter stitch bonded to the stud bump on the destination bond pad. The bonding wire acts as an off-chip inductor or a portion of an off-chip inductor.

In one embodiment a number of bonding wires and on chip conductors are used to form an off-chip inductor. In all embodiments of the present invention, the inductance of the off-chip inductor can be adjusted or fine-tuned by adjusting a loop height of the one or more bonding wires used in the off-chip inductor. The inductance of the invention's off-chip inductor can also be adjusted by increasing or decreasing the number of bonding wires used to form the off-chip inductor. Various other details and advantages of the present invention are explained in the following detailed description.

DETAILED DESCRIPTION OF THE INVENTION

The present invention is directed to an off-chip inductor. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
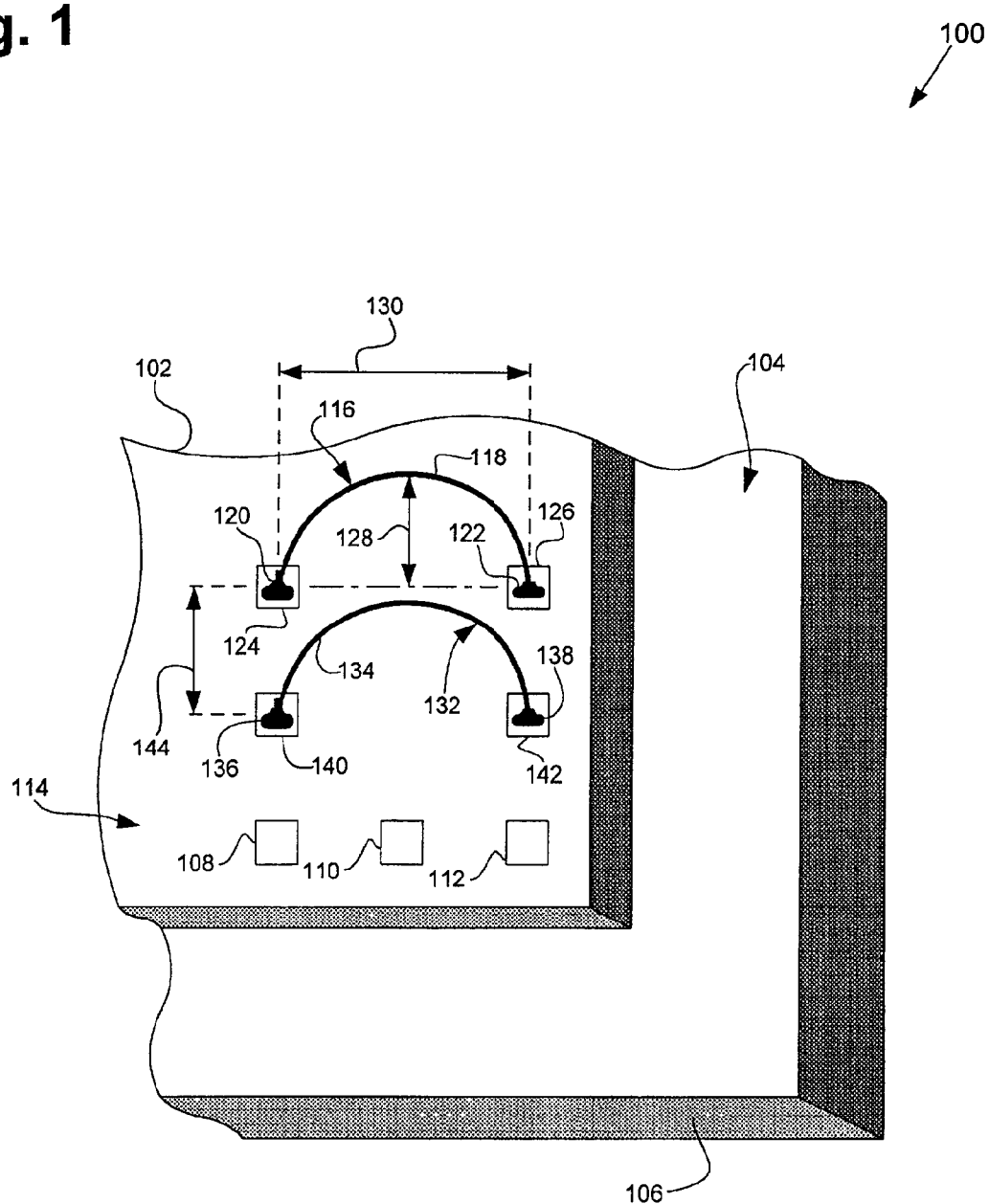
FIG. 1 illustrates a perspective view of a section of an exemplary structure containing an off-chip inductor in accordance with one embodiment of the present invention.

Structure 100 in FIG. 1 illustrates a perspective view of a section of an exemplary structure in accordance with one embodiment of the present invention. Structure 100 includes semiconductor die 102, which is situated on top surface 104 of substrate 106. It is noted that a "semiconductor die," such as semiconductor die 102, is also referred to as a "die," a "chip," or a "semiconductor chip" in the present application. Semiconductor die 102 can be attached to top surface 104 of substrate 106 by die attach (not shown in FIG. 1), or by other methods known in the art.

As shown in FIG. 1, semiconductor die bond pads 108, 110, and 112 are situated on top surface 114 of semiconductor die 102. Semiconductor die bond pads 108, 110, and 112 are general purpose semiconductor die bond pads that can be utilized, for example, to electrically connected semiconductor die 102 to substrate bond pads (not shown in FIG. 1) on top surface 104 of substrate 106. Semiconductor die bond pads 108, 110, and 112 can be aluminum. However, semiconductor die bond pads 108, 110, and 112 may comprise other metals, such as copper, copper-aluminum alloy, or gold.

Structure 100 also includes inductor 116, which comprises bonding wire 118, stud bump 120, and ball bump 122. Inductor 116 also comprises semiconductor die bond pad 126, also referred to as a "terminal" of inductor 116, and semiconductor die bond pad 124, also referred to as a "terminal" of inductor 116 in the present application. It is noted that semiconductor die bond pads 124 and 126, respectively, are also referred to as a "destination bond pad" and a "source bond pad" in the present application.

Semiconductor die bond pads 124 and 126 are situated on top surface 114 of semiconductor die 102. Semiconductor die bond pads 124 and 126 can be aluminum. However, bond pads 124 and 126 may comprise other metals, such as copper, copper-aluminum alloy, or gold. In the present embodiment, semiconductor die bond pads 124 and 126 are specialized semiconductor die bond pads specifically fabricated on top surface 114 of semiconductor die 102 to electrically connect inductor 116 to semiconductor die 102. In other words, semiconductor die bond pads 124 and 126 are not general purpose semiconductor die bond pads, such as semiconductor die bond pad 108, typically used to electrically connect semiconductor die 102 to substrate 104. In another embodiment, inductor 116 may be electrically connected to semiconductor die 102 by general purpose semiconductor die bond pads, such as semiconductor die bond pad 108.

Also shown in FIG. 1, stud bump 120 is situated on semiconductor die bond pad 124. Stud bump 120 can be formed by first bonding a bonding wire to semiconductor die bond pad 124 using a "ball bonding" process. By way of background, in the "ball bonding" process, a "ball" is formed at the end of a bonding wire that is protruding outside of a capillary tip. The capillary is then lowered onto the semiconductor die bond pad, and the "ball" is deformed to the shape of the inside chamfer and hole of the capillary by ultrasonic energy and force. The deformed "ball" is then bonded to the semiconductor die bond pad by application of force and ultrasonic energy, among other things. After the bond between the bonding wire and semiconductor die bond pad 124 has been formed, the bonding wire is then cut above the bonding point, leaving a stud of bonding wire material, i.e. stud bump 120, remaining on semiconductor die bond pad 124. Stud bump 120 can be gold, or can comprise other metals such as copper. The process described above is utilized to form stud bump 120 on semiconductor die bond pad 124 so as to make it, i.e. bond pad 124, suitable for use as a destination bond pad. In other words, the actual bonding of bonding wire 118 begins by use of semiconductor die bond pad 126 as a source bond pad and semiconductor die bond pad 124 as a destination bond pad as described below.

As shown in FIG. 1, a first end of bonding wire 118 is connected to source bond pad 126 by ball bond 122. Ball bond 122 can be formed using the "ball bonding" process described above. A second end of bonding wire 118 is "stitch bonded" onto stud bump 120 on destination bond pad 124. Thus, bonding wire 118 provides an electrical connection between semiconductor die bond pad 124 and semiconductor die bond pad 126. Bonding wire 118 can be gold, or can comprise other metals such as copper or aluminum. The diameter of bonding wire 118 can be approximately 30.0 microns.

By way of contrast to the "stitch bonding" to a stud of bonding wire technique utilized in the present invention, in a conventional wire bonding process, a first end of a bonding wire is bonded to a source bond pad utilizing the "ball bonding" process described above. A second end of the bonding wire is then bonded to a destination bond pad by using a "wedge bonding" process. In the "wedge bonding" process, a capillary deforms the second end of the bonding wire against the destination bond pad, producing a wedge-shaped bond. Thus, as a result of the "wedge bonding" process, the second end of the bonding wire is flattened and elongated.

By "stitch bonding" to a stud of bonding wire, e.g. stud bump 120 on destination bond pad 124, the present invention provides an alternative to the conventional method of connecting bonding wire 118 directly to destination bond pad 124 using the conventional "wedge bonding" process described above. Thus, by not utilizing the "wedge bonding" process to connect bonding wire 118 to destination bond pad 124, the present invention avoids flattening or elongating the second end of bonding wire 118. As a result, the present invention allows the length of bonding wire 118 to be accurately determined. Additionally, the present invention avoids the disadvantage of having to increase the size of destination bond pad 124 to accommodate the increased size of the flattened end of bonding wire 118 that would result from utilizing the "wedge bonding" process.

An advantage of the present invention in "stitch bonding" to a stud of bonding wire, for example stud bump 120 on destination bond pad 124, is achievement of a greater "loop height" and a better control over the "loop height." To illustrate the "loop height," attention is turned to height 128 in FIG. 1 which refers to the distance between the apex of bonding wire 118 and top surface 114 of semiconductor die 102. In other words, height 128 refers to the "loop height" of bonding wire 118. In the present embodiment, loop height 128 can be approximately 50.0 microns to 200.0 microns.

Also shown in FIG. 1, distance 130 refers to the distance between the centers of semiconductor die bond pad 124 and semiconductor die bond pad 126. In other words, distance 130 refers to the distance between the center of the first terminal, i.e. semiconductor die bond pad 126, of inductor 116 and the center of the second terminal, i.e. semiconductor die bond pad 124, of inductor 116. In the present embodiment, distance 130 can be approximately 0.5 millimeter to 1.0 millimeter or greater. For a given "loop height" of bonding wire 118, i.e. loop height 128, the length of inductor 116 can be increased or decreased by increasing or decreasing distance 130, i.e. the distance between the first and second terminals of inductor 116. Also, for a given distance 130, the length of inductor 116 can be increased or decreased by increasing or decreasing loop height 128 of bonding wire 118. Since the inductance of an inductor is generally proportional to the length of the inductor, the inductance of inductor 116 can be increased or decreased by increasing or decreasing distance 130. Additionally, the inductance of inductor 116 can be increased or decreased by increasing or decreasing loop height 128 of bonding wire 118. In the present embodiment, for example, for a distance 130 equal to 0.5 millimeters and a loop height 128 equal to 100.0 microns, the inductance of inductor 116 can be approximately 0.40 nano henries ("nnH"). However, as another example, if the value of distance 130 remains equal to 0.5 millimeters and the value of loop height 128 increases to 200.0 microns, the value of the inductance of inductor 116 increases to approximately 0.45 nH.

Also shown in FIG. 1, inductor 132 comprises bonding wire 134, stud bump 136, and ball bump 138. Inductor 132 also comprises semiconductor die bond pad 140, also referred to as a "terminal" of inductor 132, and semiconductor die bond pad 142, also referred to as a "terminal" of inductor 132 in the present application. Semiconductor die bond pads 140 and 142 are situated on top surface 114 of semiconductor die 102. Semiconductor die bond pads 140 and 142 are similar to semiconductor die bond pads 124 and 126 discussed above, and comprise similar material. Semiconductor die bond pads 140 and 142 are specialized semiconductor die bond pads specifically fabricated on top surface 114 of semiconductor die 102 to electrically connect inductor 132 to semiconductor die 102.

Further shown in FIG. 1, stud bump 136 is situated on semiconductor die bond pad 140. Stud bump 136 is similar to stud bump 120 discussed above, and comprises similar material as stud bump 120. Also shown in FIG. 1, a first end of bonding wire 134 is connected to semiconductor die bond pad 142 by ball bond 138. Ball bond 138 is similar to ball bond 122 discussed above. A second end of bonding wire 134 is "stitch 15 bonded" onto stud bump 136 on semiconductor die bond pad 140. Thus, bonding wire 134 provides an electrical connection between semiconductor die bond pad 140 and semiconductor die bond pad 142. Bonding wire 134 is similar to bonding wire 118 discussed above, and can comprise similar material as bonding wire 118.

Similar to inductor 116 discussed above, the length of inductor 132 can be increased or decreased by increasing or decreasing the "loop height" of bonding wire 134. Thus, the inductance of inductor 132 can be similarly increased or decreased by increasing or decreasing the "loop height" of bonding wire 134. Also shown in FIG. 1, bond pad spacing 144 refers to the distance between semiconductor die bond pad 140 and semiconductor die bond pad 124. In other words, bond pad spacing 144 refers to the "distance" between adjacent specifically fabricated semiconductor die bond pads, i.e. semiconductor die bond pads 124 and 140. In the present embodiment, bond pad spacing 144 can be approximately 50.0 microns to 200.0 microns.

Thus, the invention's inductors illustrated in FIG. 1 provide an inductance that can be adjusted or "fine-tuned" by appropriately increasing or decreasing the "loop height" of the bonding wires that forms the inductors. Also, the invention's inductors comprise bonding wires with an approximate diameter of 30.0 microns, which are much thicker and thus have much lower resistance than an approximately 2.0 micron trace width of a typical on-chip inductor. Since the quality factor ("Q") of an inductor is inversely proportional to the resistance of the inductor, the "Q" of the invention's inductors illustrated in FIG. 1 is much higher than the "Q" that can be realized by a typical on-chip inductor. Moreover, the invention's inductor illustrated in FIG. 1 does not require additional space on the semiconductor die, since the inductor takes advantage of the space freely available on the top surface of the semiconductor die which space is otherwise not utilized. As such, the invention provides a cost effective off-chip inductor since the invention does not require larger or more expensive dies.

Figure 2:
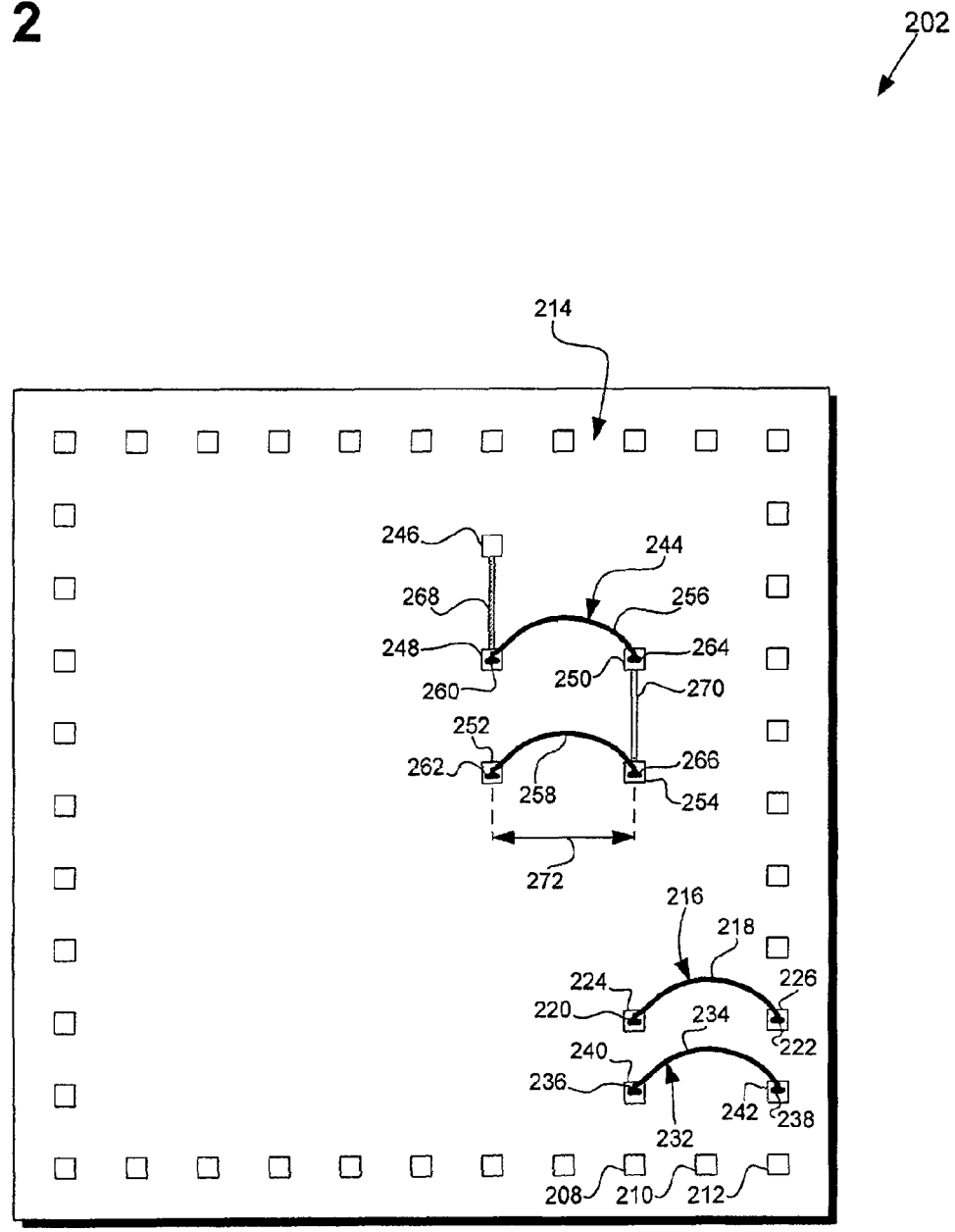
FIG. 2 illustrates a top view of a semiconductor die containing an off-chip one embodiment of the present invention.

Referring now to FIG. 2, semiconductor die 202 illustrates a top view of a semiconductor die in accordance with one embodiment of the present invention. Semiconductor die 202 corresponds to semiconductor 102 in FIG. 1. In particular, top surface 214, inductors 216 and 232, bonding wires 218 and 234, stud bumps 220 and 236, ball bumps 222 and 238, and semiconductor die bond pads 208, 210, 212, 224, 226, 240, and 242, respectively, correspond to top surface 114, inductors 116 and 132, bonding wires 118 and 134, stud bumps 120 and 136, ball bumps 122 and 138, and semiconductor die bond pads 108, 110, 112, 124, 126, 140, and 142 in FIG. 1.

Now discussing other aspects of FIG. 2, inductor 244 comprises semiconductor die bond pads 246, 248, 250, 254, and 252, bonding wires 256 and 258, stud bumps 260 and 262, ball bumps 264 and 266, and trace metal segments 268 and 270. It is noted that semiconductor die bond pad 246 is also referred to as a "terminal" of inductor 244, and semiconductor die bond pad 252 is also referred to as a "terminal" of inductor 244 in the present application. It is also noted that each of trace metal segments 268 and 270 is also referred to as a "conductor" in the present application.

As shown in FIG. 2, semiconductor die bond pads 246, 248, 250, 252, and 254 are situated on top surface 214 of semiconductor die 202. Semiconductor die bond pads 246, 248, 250, 252, and 254 are similar to semiconductor die bond pad 124 in FIG. 1, and comprise similar material as semiconductor die bond pad 124. Semiconductor die bond pads 246, 248, 250, 252, and 254 are specialized semiconductor die bond pads specifically fabricated on top surface 114 to form part of inductor 244. It is noted that semiconductor die bond pads 248 and 252 are also referred to as "destination bond pads" in the present application. Also, semiconductor die bond pads 250 and 254 are also referred to as "source bond pads" in the present application.

Also shown in FIG. 2, stud bumps 260 and 262, respectively, are situated on semiconductor die bond pads 248 and 252. Stud bumps 260 and 262 are similar to stud bump 120 in FIG. 1, and comprise similar material as stud bump 120. Further shown in FIG. 2, a first end of bonding wire 256 is bonded to semiconductor die bond pad 250 by ball bond 264. Ball bond 264 is similar to ball bond 122 in FIG. 1. A second end of bonding wire 256 is "stitch bonded" onto stud bump 260 on semiconductor die bond pad 248. Thus, bonding wire 256 provides an electrical connection between semiconductor die bond pads 248 and 250. Bonding wire 256 is similar to bonding wire 118 in FIG. 1, and can comprise similar material as bonding wire 118.

Also shown in FIG. 2, a first end of bonding wire 258 is bonded to semiconductor die bond pad 254 by ball bond 266. Ball bond 266 is similar to ball bond 122 in FIG. 1. A second end of bonding wire 258 is "stitch bonded" onto stud bump 262 on semiconductor die bond pad 252. Thus, bonding wire 258 provides an electrical connection between semiconductor die bond pads 252 and 254. Bonding wire 258 is similar to bonding wire 118 in FIG. 1, and can comprise similar material as bonding wire 118.

Further shown in FIG. 2, trace metal segment 268 is fabricated on top surface p, 214 of semiconductor die 202, and electrically connects semiconductor die bond pad 246 to semiconductor die bond pad 248. Trace metal segment 268 can comprise aluminum or other metal such as copper. Also shown in FIG. 2, trace metal segment 270 is fabricated on top surface 214 of semiconductor die 202, and electrically connects semiconductor die bond pad 250 to semiconductor die bond pad 254. Trace metal segment 270 is similar to trace metal segment 268, and can comprise similar material as trace metal segment 268.

In the present embodiment, the length of trace metal segments 268 and 270 can be approximately 40.0 microns to 60.0 microns. Further shown in FIG. 2, distance 272 refers to the distance between the centers of semiconductor die bond pads 252 and 254. In the present embodiment, distance 272 can be approximately 0.5 millimeter to 1.0 millimeter.

The length of inductor 244 is equal to the sum of the lengths of trace metal segments 268 and 270 and the length of bonding wires 256 and 258. Thus, the inductance of inductor 244 is proportional to the sum of the lengths of trace metal segments 268 and 270 and the lengths of bonding wires 256 and 258. For example, increasing the height of the "loop" formed by bonding wire 256 will increase the length of bonding wire 256. An increase in the length of bonding wire 256 will result in an increase in the inductance of inductor 244. By way of another example, decreasing the height of the "loop" of bonding wire 258 will decrease the length of bonding wire 258, which will result in a decrease in the inductance of inductor 244.

By way of further example, removing bonding wire 258 to reduce the overall length of inductor 244 can also decrease the inductance of inductor 244. Thus, inductor 244 that can be adjusted or fine-tuned to meet a required inductance in a particular application by appropriately decreasing or increasing the length of inductor 244 by removing or adding bonding wires and/or decreasing or increasing the height of the "loop" formed by bonding wires 256 and 258.

In one embodiment, an inductor can be formed on the top surface of a semiconductor die comprising multiple "turns" formed by bonding wires. The bonding wires can be bonded to specialized semiconductor die bond pads, such as semiconductor die bond pad 248 in FIG. 2. In such instance, the spacing, e.g. bond pad spacing 144 in FIG. 1, between the centers of adjacent specialized semiconductor die bond pads will be at least 50.0 microns. Accordingly, the "pitch" of the inductor's "turns" will be at least 50.0 microns. This "pitch" is much greater than the approximate 1.0 micron "pitch" of an onchip inductor. Thus, the invention's inductor will have much lower capacitive coupling between adjacent "turns" than the on-chip inductor. Also, since capacitive coupling is inversely proportional to the quality factor ("Q") of an inductor, the invention's inductor will have a much higher "Q" than the on-chip inductor.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, an off-chip inductor has been described. What is claimed is:

What is claimed is:

1. A structure comprising:
   a semiconductor die having a source bond pad and a destination bond pad attached to a top surface of said semiconductor die;
   a stud of bonding wire material, said stud of wire material being situated on said destination bond pad;
   a bonding wire having a first end and a second end, said first end of said bonding wire being ball bonded to said source bond pad and said second end of said bonding wire being stitch bonded directly to said stud of bonding wire material, said bonding wire having an inductance defined by at least a first selected dimension of said bonding wire, wherein said first selected dimension is measured along a first axis substantially perpendicular to said top surface of said semiconductor die.

2. The structure of claim 1 wherein said source bond pad is a first terminal of an inductor and said destination bond pad is a second terminal of said inductor.

3. The structure of claim 1 wherein said source bond pad is not used to establish an electrical connection between said semiconductor die and a substrate, and wherein said destination bond pad is not used to establish an electrical connection between said semiconductor die and a substrate.

4. The structure of claim 1 wherein said inductance is further defined by at least a second selected dimension of said bonding wire, wherein said second selected dimension is measured along a second axis substantially parallel to said top surface of said semiconductor die.

5. The structure of claim 1 wherein said inductance is increased by increasing said first selected dimension of said bonding wire, and wherein said inductance is decreased by decreasing said first selected dimension of said bonding wire.

6. A structure comprising:
   a semiconductor die having a first semiconductor die bond pad, a second semiconductor die bond pad, and a third semiconductor die bond pad attached to a top surface of said semiconductor die;
   a first conductor providing a connection between said first semiconductor die bond pad and said second semiconductor die bond pad;
   a stud of bonding wire material situated on said second semiconductor die bond pad;
   a bonding wire having a first end and a second end, said first end of said bonding wire being ball bonded to said third semiconductor die bond pad and said second end of said bonding wire being stitch bonded directly to said stud of bonding wire material said bonding wire having an inductance defined by at least a selected dimension of said bonding wire, wherein said selected dimension is measured along an axis substantially perpendicular to said top surface of said semiconductor die.

7. The structure of claim 6 wherein said first semiconductor die bond pad is a first terminal of an inductor.

8. The structure of claim 6 wherein said second semiconductor die bond pad is a destination bond pad and said third semiconductor die bond pad is a source bond pad.

9. The structure of claim 6 wherein said first, second, and third semiconductor die bond pads are not used to establish an electrical connection between said semiconductor die and a substrate.

10. The structure of claim 6 further comprising a second conductor provides a connection between said third semiconductor die bond pad a fourth semiconductor die bond pad.

11. The structure of claim 6 wherein said inductance is increased by increasing a said selected dimension of said bonding wire, and wherein said inductance is decreased by decreasing said selected dimension of said bonding wire.

12. A method for fabricating an inductor, said method comprising steps of:
- fabricating a source bond pad and a destination bond pad on a top surface of a semiconductor die;
- forming a stud of bonding wire material on said destination bond pad;
- ball bonding a first end of a bonding wire to said source bond pad;
- stitch bonding a second end of said bonding wire directly to said stud of bonding wire material;
- said source bond pad being a first terminal of said inductor and said destination bond pad being a second terminal of said inductor, said inductor having an inductance defined by at least a first selected dimension of said bonding wire, wherein said first selected dimension is measured along a first axis substantially perpendicular to said top surface of said semiconductor die, wherein said step of forming said stud of bonding wire material on said destination bond pad is performed prior to said step of ball bonding said first end of said bonding wire to said source bond pad.

13. The method of claim 12 wherein said source bond pad is not used to establish an electrical connection between said semiconductor die and a substrate, and wherein said destination bond pad is not used to establish an electrical connection between said semiconductor die and a substrate.

14. The method of claim 12 wherein said inductance is further defined by at least a second selected dimension of said bonding wire, wherein said second selected dimension is measured along a second axis substantially parallel to said top surface of said semiconductor die.

15. The method of claim 12 wherein said inductance is increased by increasing a said first selected dimension of said bonding wire, and wherein said inductance is decreased by decreasing said first selected dimension of said bonding wire.

* * * * *